United States Patent
Kirkpatrick et al.

(10) Patent No.: US 8,252,609 B2
(45) Date of Patent: Aug. 28, 2012

(54) CURVATURE REDUCTION FOR SEMICONDUCTOR WAFERS

(75) Inventors: Brian K. Kirkpatrick, Allen, TX (US); Steven L. Prins, Fairview, TX (US); Amitabh Jain, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 11 days.

(21) Appl. No.: 12/757,704

(22) Filed: Apr. 9, 2010

(65) Prior Publication Data

US 2010/0261298 A1    Oct. 14, 2010

Related U.S. Application Data

(60) Provisional application No. 61/167,921, filed on Apr. 9, 2009.

(51) Int. Cl.
*H01L 21/26* (2006.01)
*H01L 21/66* (2006.01)

(52) U.S. Cl. .................. 438/16; 438/798; 257/E21.328; 257/E21.53

(58) Field of Classification Search ............... 438/16, 438/798
See application file for complete search history.

(56) References Cited

U.S. PATENT DOCUMENTS

| 5,953,615 A | 9/1999 | Yu |
| 2008/0057684 A1* | 3/2008 | de Souza et al. ............. 438/530 |
| 2008/0272097 A1 | 11/2008 | Bu et al. |
| 2009/0278287 A1 | 11/2009 | Wang et al. |
| 2009/0309191 A1 | 12/2009 | Theuss |

FOREIGN PATENT DOCUMENTS

| JP | 62252937 | 11/1987 |
| KR | 2009007068 | 7/2009 |

* cited by examiner

*Primary Examiner* — Alexander Ghyka
(74) *Attorney, Agent, or Firm* — Jacqueline J. Garner; Wade J. Brady, III; Frederick J. Telecky, Jr.

(57) ABSTRACT

A method for reducing curvature of a wafer having a semiconductor surface. One or more process steps are identified at which wafers exhibit the largest curvature, and/or wafer curvature that may reduce die yield. A crystal damaging process converts at least a portion of the semiconductor surface into at least one amorphous surface region After or contemporaneously with the crystal damaging, the amorphous surface region is recrystallized by recrystallization annealing that anneals the wafer for a time ≦5 seconds at a temperature sufficient for recrystallization of the amorphous surface region. A subsequent photolithography step is facilitated due to the reduction in average wafer curvature provided by the recrystallization.

21 Claims, 1 Drawing Sheet

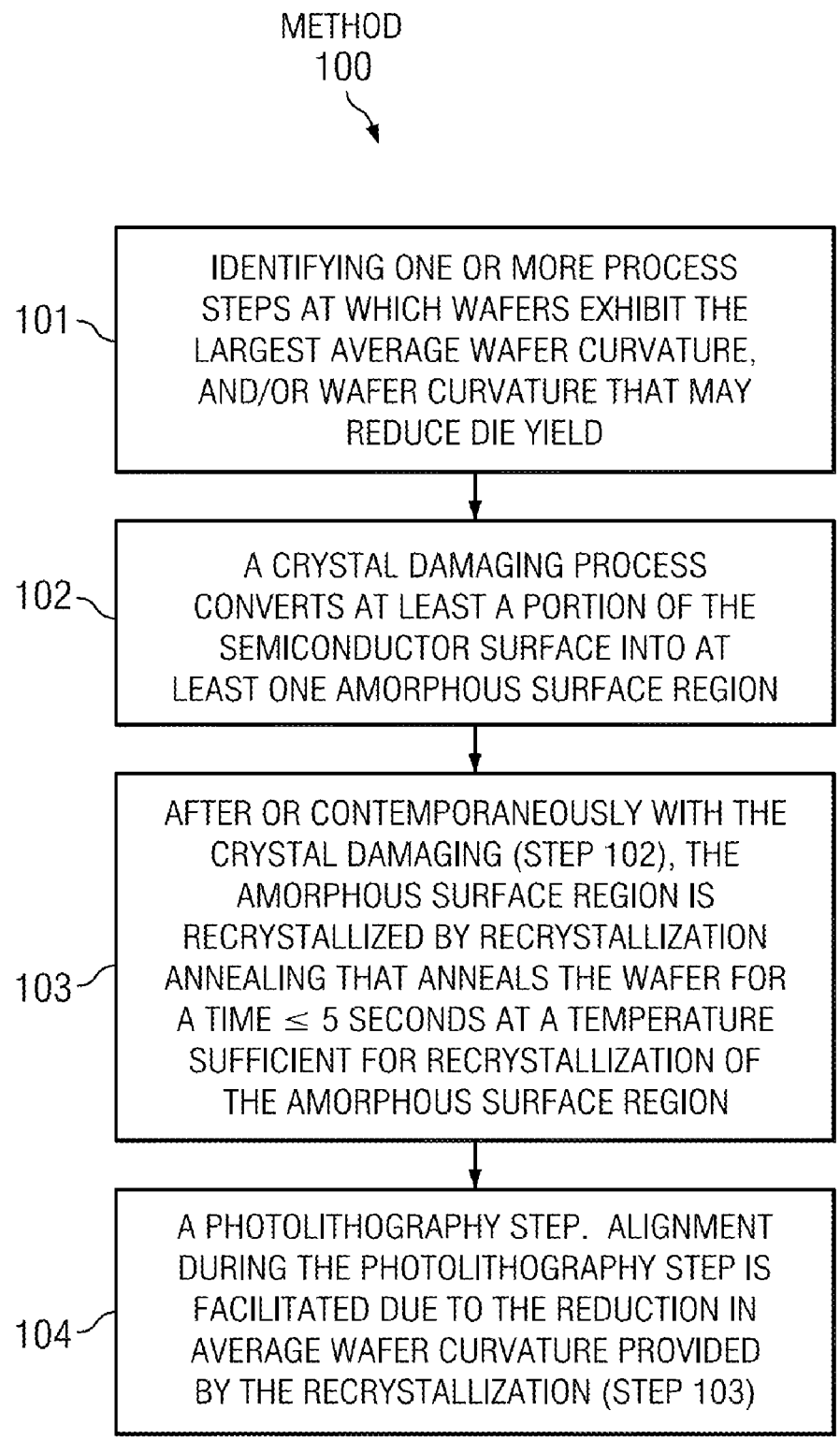

CURVATURE REDUCTION FOR SEMICONDUCTOR WAFERS

CROSS REFERENCE TO RELATED APPLICATIONS

This application and the subject matter disclosed herein claims the benefit of Provisional Application Ser. No. 61/167,921 entitled "Novel Method to Achieve Globally Planar Wafers", filed Apr. 9, 2009, which is herein incorporated by reference in its entirety.

FIELD

Disclosed embodiments relate to integrated circuits (IC) and IC processing, more specifically to methodologies for reducing the curvature of wafers to improve lithographic processing.

BACKGROUND

When processing semiconductor wafers, different process steps have been found to result in changes to the flatness, bow or warpage across the area of the wafer (referred to herein collectively as global wafer "curvature"). These changes in wafer curvature can directly impact photolithographic alignment and focus. When the global wafer curvature changes enough from one stage of the process flow to another, such as between the gate pattern to contact pattern, photolithographic alignment can become difficult, or even not possible (e.g., due too large a differential in the depth of focus within a scanner/stepper shot), and a significant yield loss may result.

Known approaches for controlling global wafer curvature generally involve changing the process(es) that are found to generate the most curvature. For example, in a MOS process flow, the source/drain anneal temperature or time at the peak temperature may be reduced to reduce the magnitude of the curvature induced. However, since the functions of the source/drain anneal functions include dopant activation, such changes can result in degraded device performance, such as an increase in on resistance ($R_{ON}$). For example, $R_{ON}$ is an important performance figure of merit for MOSFET switching devices and is defined as the ohmic resistance that exists between an input and an output pin of a MOSFET switch when the switch is closed and passing a signal. A lower $R_{ON}$*Area allows a designer to use a smaller MOSFET to meet ON resistance requirements for a given application, which reduces the area and cost of a power integrated circuit.

SUMMARY

Disclosed embodiments include methods for reducing curvature of a wafer having a semiconductor surface. The Inventors have discovered that although high temperature processing of the wafer leads to an increase wafer curvature, a new two-step process comprising an amorphization step followed by a high temperature anneal that recrystallizes the amorphous regions referred to herein as a "recrystallization anneal" allows the wafer curvature to be reduced.

A crystal damaging step results in at least a portion of the semiconductor surface of the wafer that is ordinarily single crystal being converted into at least one amorphous surface region. The crystal damaging is generally a global (i.e., across the wafer) process. After or contemporaneously with the crystal damaging, the amorphous surface region is recrystallized by a recrystallization anneal that anneals the wafer for a time $\leq 5$ seconds at a temperature sufficient for recrystallization of the amorphous surface region. The wafer has less average curvature after the recrystallization anneal as compared to the average curvature of the wafer following the high temperature anneal.

Disclosed embodiments thus improve photolithographic alignment by reducing wafer curvature. Disclosed embodiments avoid the need to reduce high temperature annealing times or temperatures, such as the source/drain anneal for MOS devices, which as noted above is the conventional approach for reducing wafer curvature for processing of MOS ICs which can result in degraded device performance. Notably, the recrystallization anneal as disclosed herein is performed to provide recrystallization of amorphous surface regions while minimizing dopant diffusion due to the short times used, which can be compared to conventional annealing that is performed to diffuse and activate dopants.

BRIEF DESCRIPTION OF THE DRAWING

FIG. 1 shows steps in an exemplary method for reducing average curvature of a wafer having a semiconductor surface, according to a disclosed embodiment.

DETAILED DESCRIPTION

Disclosed embodiments in this Disclosure are described with reference to the attached FIGURES, wherein like reference numerals are used throughout the FIGURES to designate similar or equivalent elements. The FIGURES are not drawn to scale and they are provided merely to illustrate the disclosed embodiments. Several aspects are described below with reference to example applications for illustration. It should be understood that numerous specific details, relationships, and methods are set forth to provide a full understanding of the disclosed embodiments. One having ordinary skill in the relevant art, however, will readily recognize that the subject matter disclosed herein can be practiced without one or more of the specific details or with other methods. In other instances, well-known structures or operations are not shown in detail to avoid obscuring structures or operations that are not well-known. This Disclosure is not limited by the illustrated ordering of acts or events, as some acts may occur in different orders and/or concurrently with other acts or events. Furthermore, not all illustrated acts or events are required to implement a methodology in accordance with this Disclosure.

Notwithstanding that the numerical ranges and parameters setting forth the broad scope of this Disclosure are approximations, the numerical values set forth in the specific examples are reported as precisely as possible. Any numerical value, however, inherently contains certain errors necessarily resulting from the standard deviation found in their respective testing measurements. Moreover, all ranges disclosed herein are to be understood to encompass any and all sub-ranges subsumed therein. For example, a range of "less than 10" can include any and all sub-ranges between (and including) the minimum value of zero and the maximum value of 10, that is, any and all sub-ranges having a minimum value of equal to or greater than zero and a maximum value of equal to or less than 10, e.g., 1 to 5.

Disclosed embodiments describe methods for reducing the average curvature of wafers that generally include an amorphization step followed by a recrystallization anneal that heats the wafer sufficiently to cause recrystallization, thereby relieving stress and flattening the wafer surface to reduce curvature. Methodologies described herein can reduce stress induced curvature, without degrading device performance, and in some cases improving device performance. Because the recrystallization anneal time is short (≦5 seconds, and in some embodiments on the order of or ≦1 msec), dopant diffusion is minimized allowing very shallow junction depths to be maintained because of the short annealing times.

FIG. 1 shows steps in an exemplary method 100 for reducing the average curvature of a wafer having a crystalline semiconductor surface, according to a disclosed embodiment. The wafer can comprise any substrate used for semiconductor devices, including but not limited to, silicon (Si), SiC, germanium (Ge), Si/Ge, GaAs, GaN, InGaAs or semiconductor on insulator (SOI).

Step 101 comprises identifying one or more process steps at which wafers exhibit the largest curvature, and/or wafer curvature that may reduce die yield. For a typical process the contact process is a process step at which wafers may exhibit the largest curvature, which if processed without the corrective wafer curvature reducing processing disclosed herein, can significantly reduce die yield. In the case of the contact process for MOS devices, a high temperature source/drain anneal (e.g., 850 to 1150° C.) that activates the majority of implanted dopant (relative to the activated dopant level in the final IC) from earlier ion implantation steps may be the cause of a large part of the wafer curvature seen at the contact level.

The wafer curvature information is generally obtained for each wafer, and can be entered into a database that stores the curvature information by wafer. As known in the art, wafers generally include a machine readable wafer identifier and reference orientation. Depending on the curvature data the specific parameters used, the method can be customized to minimize the curvature following performance of the method. Generally, curvature information is obtained for a plurality of portions for each wafer, such as wafer portions defined by each scanner/stepper shot, or in another embodiment from each individual die. Curvature information for a plurality of portions for each wafer allows the curvature reduction treatment to be different (i.e., customized) across the wafer, such as using different laser anneal parameters across the wafer. In other embodiments, curvature reduction processing may be performed globally (e.g., the recrystallization anneal conditions used are the same die-to-die).

Wafer curvature can be measured using a variety of methods. One method uses the photolithographic tool to obtain the curvature data. Wafer curvature impacts the location of alignment marks patterned on the wafer. Multiple alignment marks are typically distributed across the exposure field, and therefore the entire surface of the wafer. The relative location of all of these alignment marks can be characterized on the photolithographic tool prior to exposure. This information is used to align the photo mask to existing patterns and is also used to provide a measure of quality of alignment that is expected to be achieved. Alignment mark characterization provides an indirect measure of curvature, because the degree of wafer curvature mismatch between pattern levels requiring alignment with respect to each other can be observed in this alignment mark characterization data.

Wafer curvature can also be quantified using a plurality of other methods. For example, a tool for obtaining wafer curvature data is disclosed in U.S. Pat. Nos. 5,134,303 and 5,248,889. Briefly, devices of the type described in these patents operate by directing a probe beam onto the surface of the wafer. A position sensitive photodetector is then used to measure the location of the reflected probe beam. During calibration, the central portion of the position sensitive photodetector is arranged to coincide with the location where the reflected probe beam would fall (based on Snell's Law) if the wafer surface was flat. Any bow or tilt in the wafer surface will change the direction of the beam, causing a displacement of the reflected probe beam on the photodetector. The amount and direction of the displacement of the reflected probe beam on the detector provides a measure of the direction and extent of the bow or warp of the wafer.

In step 102, a crystal damaging process converts at least a portion of the semiconductor surface into at least one amorphous surface region. The resulting amorphous surface region generally averages between 5 nm and 300 nm in thickness, such as between 10 and 100 nm. In one embodiment, the crystal damaging process follows a high temperature anneal step that activates implanted dopant from an earlier ion implantation step(s).

An amorphous layer or region as defined herein is a layer or region that lacks pronounced crystalline structure, which can be evidenced by an X-ray diffraction pattern obtained by the X-ray diffraction technique having no sharp peaks, and generally no discernable peaks at all. The amorphous layer or region can thus include polycrystalline layers that comprise a plurality of crystallites which have grain boundary regions there between since short range order provided by the individual crystallites will not interact with the incident x-ray beam to generate strong coherent diffraction signals.

In one embodiment, the crystal damaging comprises ion implantation of at least one non-dopant species using a dose $\geq 3 \times 10^{14}$ cm$^{-2}$. Typically, the dose is from $3 \times 10^{14}$ cm$^{-2}$ to $5 \times 10^{16}$ cm$^{-2}$ and the implant energy ranges from 5 to 180 keV. The non-dopant species can comprise species such as Ar, Kr, Xe, Ge, or Si. The implantation can be performed at a plurality of different implant energies, such as 20, 35 and 50 keV to provide a thicker amorphous layer as compared to an amorphous layer achieved using a single implant energy. The ion implantation can be performed on a cooled platen so that a maximum temperature during the ion implantation is ≦5° C., such as from −100° C. (or lower temperature) to 5° C.

The ion implantation can comprise a blanket implant defined herein as an implant that takes place without a lithography step that defines a masking pattern (e.g. photoresist). As used herein a "blanket implant" includes implantation of a wafer having a hard mask (e.g. silicon nitride) on the gate stack for a MOS processes from an earlier processing level (e.g., gate delineation), which can prevent the implanted non-dopant species from reaching the gate electrode or gate dielectric disposed under the gate electrode.

The crystal damaging can also comprise depositing a tensile stress generating film on the crystalline semiconductor surface. For example, in one particular embodiment, 150 nm to 500 nm of high stress blanket silicon nitride is used which can be deposited by a LPVD process comprising dichlorosilane (DCS) and ammonia at around 800° C. at about 200 mTorr pressure. Another exemplary high stress layer is silicon/germanium wherein a concentration of germanium is ≧40 atomic %. In these stress layer embodiments, the subsequent recrystallization annealing (step 103) first generates the crystal damage that provides the amorphous surface region and then recrystallizes the amorphous surface region as described below.

In another embodiment, the crystal damaging comprises melting the semiconductor surface using laser irradiation for 1 to 500 psec followed by very rapid quenching to form the amorphous surface region. For example, see Bucksbaum et al, "Measurement of Fast melting and Regrowth Velocities in Picosecond Laser Heated Silicon", Mat. Res. Soc. Symp. Proc. Vol. 13 (1983) Elsevier Science Publishing Co., Inc.

In step 103, after or contemporaneously with the crystal damaging, the amorphous surface region is recrystallized by recrystallization annealing that anneals the wafer for a time (t)

0.1 msec≦t≦5 seconds, at a temperature sufficient for recrystallization of the amorphous surface region. The recrystallization may proceed by solid phase epitaxy (SPE), and can utilize a temperature as low as 700° C., or as high as about 1400° C. The recrystallization annealing is generally performed in a pressure range from 0.01 to 2 atmospheres. The wafer has less average curvature after the recrystallization anneal as compared to the average curvature of the wafer before the crystal damaging.

In one embodiment the recrystallization annealing comprises laser spike annealing (LSA) for a time ≦1 msec at a peak temperature between 1175 and 1375° C. During LSA, thermal energy for annealing is provided by applying laser light to the surface of the wafer for very short time intervals, typically from several nanoseconds to several milliseconds. Heat energy from the laser light raises the temperature of the wafer surface to very high temperatures for annealing, typically in excess of 1000° C.

In one embodiment, the recrystallization annealing comprises flash lamp annealing (FLA) for a time ≦5 msec, such as ≦1 msec at a peak temperature between 1175 and 1375° C. FLA generally uses a xenon (Xe) flash lamp which is a white light (i.e., broadband) source having a wide range light-emitting wavelength, from the visible region to near-infrared region. The time for FLA is typically several 100 μs to 10 ms.

In yet another embodiment, the annealing comprises rapid thermal annealing (RTA) for a time between 0.5 and 5 seconds at a temperature between 900 and 1100° C. Rapid thermal anneals are performed by equipment that heats a single wafer at a time using either lamp (e.g. tungsten-halogen) based heating, a hot chuck, or a hot plate that a wafer is brought near.

Step 104 comprises a photolithography step. Alignment during the photolithography step is improved due to the reduction in wafer curvature provided by the recrystallization anneal (step 103) as described above. Method 100 can be applied to two or more different alignment steps, such as to decrease average wafer curvature for both the gate and contact levels in a MOS process.

The active circuitry formed on the top semiconductor surface comprises circuit elements that generally include transistors, diodes, capacitors, and resistors, as well as signal lines and other electrical conductors that interconnect these various circuit elements.

Disclosed embodiments can be integrated into a variety of process flows to form a variety of devices and related products. The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, disclosed embodiments can be used in a variety of processes including bipolar, CMOS, BiCMOS and MEMS.

EXAMPLES

Disclosed embodiments are further illustrated by the following specific Examples, which should not be construed as limiting the scope or content of this Disclosure in any way.

A series of experiments were performed to quantify wafer curvature reduction as a function of crystal damaging and/or recrystallization annealing processing according to various embodiments of the invention, along with some controls. The lithographic tool was used to measure wafer curvature CHECK. The wafers were provided with an initial warpage of about 37 μm from center to edge. The annealing comprised LSA at 1275° C. or 1325° C. for 0.8 msec, and the crystal damaging comprised a Ge implant using a dose of $4 \times 10^{14}$ cm$^{-2}$, and an energy 20 keV.

Without the Ge implant to amorphize the silicon surface, neither LSA anneal split (1275° C. or 1325° C.) was found to measurably changed the wafer warpage. However, when the amorphizing Ge implant was coupled with either LSA anneal, a significant reduction in wafer warpage was found. Specifically, for the 1275° C. LSA anneal, the wafer warpage was found to be reduced to about 30 μm from center to edge, while for the 1325° C. LSA anneal, the wafer warpage was found to be reduced to only about 7 μm from center to edge.

While various disclosed embodiments have been described above, it should be understood that they have been presented by way of example only, and not limitation. Numerous changes to the subject matter disclosed herein can be made in accordance with this Disclosure without departing from the spirit or scope of this Disclosure. In addition, while a particular feature may have been disclosed with respect to only one of several implementations, such feature may be combined with one or more other features of the other implementations as may be desired and advantageous for any given or particular application.

Thus, the breadth and scope of the subject matter provided in this Disclosure should not be limited by any of the above explicitly described embodiments. Rather, the scope of this Disclosure should be defined in accordance with the following claims and their equivalents.

The terminology used herein is for the purpose of describing particular embodiments only and is not intended to be limiting. As used herein, the singular forms "a," "an," and "the" are intended to include the plural forms as well, unless the context clearly indicates otherwise. Furthermore, to the extent that the terms "including," "includes," "having," "has," "with," or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which embodiments of the invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The invention claimed is:

1. A method for reducing curvature of a wafer having a semiconductor surface, comprising:
    crystal damaging at least a portion of said semiconductor surface to convert said semiconductor surface into at least one amorphous surface region, wherein before said crystal damaging said wafer receives an anneal step at a temperature of at least 850° C. that activates a majority of implanted dopant from an earlier ion implant step, and
    after or contemporaneously with said crystal damaging, recrystallization annealing said amorphous surface region by annealing said wafer for a time ≦5 seconds at a temperature sufficient for recrystallization of said amorphous surface region,
    wherein said wafer has less average curvature after said recrystallizing annealing as compared to an average curvature of said wafer before said crystal damaging.

2. The method of claim 1, wherein before said crystal damaging said wafer receives a deposition of a blanket silicon nitride or silicon/germanium wherein a concentration of germanium is ≧40 atomic %.

3. The method of claim 1, wherein said crystal damaging comprises ion implantation of at least one non-dopant species using a total dose of $\geq 3 \times 10^{14}$ cm$^{-2}$.

4. The method of claim 3, wherein said ion implantation is performed on a cooled platen so that a maximum temperature during said ion implantation is $\leq 5°$ C.

5. The method of claim 3, wherein said ion implantation is performed at a plurality of different implant energies.

6. The method of claim 3, wherein said ion implantation comprises a blanket implant.

7. The method of claim 3, wherein said non-dopant species comprises Ar, Kr, Xe, Ge, or Si.

8. The method of claim 1, wherein said amorphous surface region averages between 10 and 100 nm in thickness across said wafer.

9. The method of claim 1, wherein said recrystallization annealing comprises laser spike annealing (LSA) for a time $\leq 5$ msec at a peak temperature between 1175 and 1350° C.

10. The method of claim 1, wherein said recrystallization annealing comprises flash lamp annealing (FLA) for a time $\leq 5$ msec at a peak temperature between 1175 and 1350° C.

11. The method of claim 1, wherein said recrystallization annealing comprises rapid thermal annealing (RTA) for a time between 0.5 and 5 seconds at a temperature between 900 and 1100° C.

12. The method of claim 1, wherein said recrystallization annealing is performed in a pressure range from 0.01 to 2 atmospheres.

13. A method for reducing curvature of a wafer having a semiconductor surface, comprising:
    crystal damaging at least a portion of said semiconductor surface to convert said semiconductor surface into at least one amorphous surface region, and
    after or contemporaneously with said crystal damaging, recrystallization annealing said amorphous surface region by annealing said wafer for a time $\leq 5$ seconds at a temperature sufficient for recrystallization of said amorphous surface region,
    wherein said wafer has less average curvature after said recrystallizing annealing as compared to an average curvature of said wafer before said crystal damaging,
    wherein said method is repeated prior to two or more different alignment steps.

14. The method in claim 13, wherein one of said two or more different alignment steps comprises a contact level to contact said semiconductor surface and wherein before said crystal damaging said wafer receives a source/drain anneal performed at a temperature of at least 850° C. that activates a majority of implanted dopant from at least one earlier ion implant step.

15. The method in claim 1, wherein said crystal damaging comprises melting said semiconductor surface using laser irradiation for 1 to 500 psec followed by quenching to form said amorphous surface region.

16. The method in claim 1, wherein said wafer comprises silicon, germanium, GaAs, GaN, InGaAs or a semiconductor on insulator (SOI) wafer.

17. The method in claim 1, further comprising measuring said average curvature of said wafer before said crystal damaging in a plurality of portions of said wafer.

18. The method in claim 17, wherein said plurality of portions of said wafer are defined by a scanner/stepper shot, and said measuring is provided by a photolithographic tool.

19. The method of claim 17, wherein said recrystallization annealing comprises laser spike annealing (LSA) or flash lamp annealing (FLA) that varies in annealing time or annealing temperature across said wafer to take into account said average wafer curvature for said plurality of portions of said wafer.

20. A method for reducing curvature of a wafer having a semiconductor surface, comprising:
    ion implanting at least one non-dopant species using a dose of $\geq 3 \times 10^{14}$ cm$^{-2}$ to damage at least a portion of said semiconductor surface to convert said semiconductor surface into at least one amorphous surface region, and
    recrystallizing said amorphous surface region by recrystallization annealing said wafer for a time $\leq 5$ seconds at a temperature sufficient for recrystallization of said amorphous surface region,
    wherein said recrystallization annealing comprises laser spike annealing (LSA) or flash lamp annealing (FLA) for a time $\leq 1$ msec at a peak temperature between 1175 and 1350° C., and
    wherein said wafer has less average curvature after said recrystallization annealing as compared to an average curvature of said wafer before said ion implanting.

21. The method of claim 20, wherein said non-dopant species comprises Ar, Kr, Xe, Ge, or Si.

* * * * *